United States Patent
Kobayashi (10) Patent No.: US 6,900,597 B2
(45) Date of Patent: May 31, 2005

(54) EMITTER, METHOD OF DESIGNING BRIGHTNESS OF EMITTER, PROGRAM FOR METHOD OF DESIGNING BRIGHTNESS OF EMITTER, ELECTROOPTICAL DEVICE AND ELECTRIC DEVICE

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 246 days.

(21) Appl. No.: 10/309,195

(22) Filed: Dec. 4, 2002

(65) Prior Publication Data

US 2003/0141808 A1 Jul. 31, 2003

(30) Foreign Application Priority Data

Dec. 20, 2001 (JP) .................................. 2001-388388
Nov. 27, 2002 (JP) .................................. 2002-343969

(51) Int. Cl.[7] .............................................. G09G 3/10
(52) U.S. Cl. ................................. 315/169.3; 345/77
(58) Field of Search .................... 315/169.3, 169.1, 315/169.4; 345/76, 77, 82, 83; 313/498, 500

(56) References Cited

U.S. PATENT DOCUMENTS 6,541,921 B1 * 4/2003 Luciano et al. .......... 315/169.3
6,583,577 B1 * 6/2003 Choi et al. ................ 315/169.3
2004/0021423 A1 * 2/2004 Jongman et al. .......... 315/169.1

FOREIGN PATENT DOCUMENTS

| JP | A 10-12377 | 1/1998 |
| JP | A 10-39791 | 2/1998 |
| JP | A 2000-235891 | 8/2000 |
| JP | A 2000-353590 | 12/2000 |
| JP | A 2001-290441 | 10/2001 |
| JP | A 2003-168561 | 6/2003 |
| JP | A 2003-536226 | 12/2003 |
| WO | WO 01/99195 A1 | 12/2001 |

* cited by examiner

*Primary Examiner*—Hoang V. Nguyen
*Assistant Examiner*—Ephrem Alemu
(74) *Attorney, Agent, or Firm*—Oliff & Berridge, PLC (57) ABSTRACT

An emitter includes a plurality of types of emission units (for example, EL elements) with different emission aging characteristics, which can obtain good emission conditions even after a certain usage time has elapsed. A method of designing the brightness and a program for designing the brightness of the emitter, an electrooptical device and an electric device are also provided. Initial brightnesses of the emission units are set such that a skew of emission lifetime between the emission units is within 20%.

8 Claims, 7 Drawing Sheets

EMITTER, METHOD OF DESIGNING BRIGHTNESS OF EMITTER, PROGRAM FOR METHOD OF DESIGNING BRIGHTNESS OF EMITTER, ELECTROOPTICAL DEVICE AND ELECTRIC DEVICE

BACKGROUND OF THE INVENTION

1. Field of the Invention

This invention relates to an emitter such as an electroluminescence (also referred to hereunder as EL) element and the like, which is suitable for a display body or a light source, a method of designing the brightness and a program for designing the brightness of this emitter, and furthermore an electrooptical device and an electric device.

2. Background Art

Heretofore, a range of emitters such as a display body, a light source and the like using EL elements (especially, organic EL elements), being spontaneous light emitting diodes, has been proposed (for example, refer to Japanese Unexamined Patent Application, First Publication No. 10-12377 (Patent Reference 1)). An organic EL device that is capable of color display is also known as one such emitter.

In order to perform color display by an organic EL display device, it is normal to construct one picture element from an organic EL element (emission unit) that eits red, an organic EL element (emission unit) that emits green, and an organic EL element (emission unit) that emits blue, corresponding to red (R), green (G) and blue (B), being the three primary colors of light. For example, in a case where a picture element is required to be bright white, all the organic EL elements of red, green and blue may emit light. Furthermore if the emission brightness of each of the red, green and blue organic EL elements constituting one picture element is controlled appropriately, it is possible to adjust a required picture element to a desired color and brightness.

In the case where color display is performed using three organic EL elements as described above, it is known to be important to create good white balance (for example, refer to Japanese Unexamined Patent Application No. 2000-353590 (Patent Reference 2).

Accordingly, heretofore, when considering the emission brightness of the three EL elements constituting each picture element, an emission area (emission area capable of irradiating light externally) that enables a good white balance to be obtained has been determined for each of the colors, and a numerical aperture has been determined for each of the organic EL elements so as to obtain the emission area.

However, in the conventional method of obtaining numerical apertures as described above, the emission brightnesses of the organic EL elements can provide a good white balance immediately after the products are shipped. However, since different emission materials normally deteriorate differently, white balance is lost after a certain time has elapsed after first use (after the cumulative emission time reaches a certain time). Therefore there are unsolved problems in that even if a prescribed current is supplied to each organic EL element with a goal of white emission, the actual color development is not pure white, and even if another required color is intended to be developed to a required brightness, the intended color development state cannot be obtained.

The present invention addresses these unsolved problems in the conventional technique, with an object of providing an emitter comprising a plurality of types of emission units (for example, EL elements) with different emission aging characteristics, which can obtain good emission conditions even after a certain usage time has elapsed, and furthermore a method of designing the brightness and a program for designing the brightness of the emitter, an electrooptical device and an electric device.

SUMMARY OF THE INVENTION

In order to achieve the above-described objects, an emitter of the present invention is an emitter comprising a plurality of types of emission units with different emission aging characteristics, wherein initial brightnesses of the emission units are set such that a skew of emission lifetime between the emission units is within 20%.

Furthermore, in the emitter, it is preferable that the emission life of the emission units is defined as the time required until the emission brightness reaches a prescribed percentage of the initial brightness, and in this case the prescribed percentage is preferably 50%.

Moreover, in the emitter, it is possible to display colors by constructing one picture element of three dots, being an emission unit capable of developing a red color, an emission unit capable of developing a green color and an emission unit capable of developing a blue color, and it is preferable that numerical apertures of the emission units satisfy the following equation (1).

$$a_r:a_g:a_b = W_r L_g L_b : W_g L_r L_b : W_b L_r L_g \qquad \text{equation (1)}$$

Where $L_r$ is the initial brightness of the emission unit capable of developing a red color, $L_g$ is the initial brightness of the emission unit capable of developing a green color, $L_b$ is the initial brightness of the emission unit capable of developing a blue color, $a_r$ is the numerical aperture of the emission unit capable of developing a red color, $a_g$ is the numerical aperture of the emission unit capable of developing a green color, $a_b$ is the numerical aperture of the emission unit capable of developing a blue color, and $W_r:W_g:W_b$ is the brightness ratio of the colors required for the abovementioned one picture element to display white ($W_r$ corresponding to a red color, $W_g$ a green color, and $W_b$ a blue color).

Furthermore, another emitter of the present invention is an emitter comprising a plurality of types of emission units with different emission aging characteristics, wherein initial brightnesses and numerical apertures of the emission units are set such that a skew of emission intensity between the emission units is within 20% over a prescribed time.

In the emitter, it is preferable that the skew of the emission intensity between the emission units over a prescribed time is determined based on a normalized decay curve obtained by dividing a decay curve of the emission brightness of each of the emission units by the initial brightness of the emission brightness.

Furthermore, in the emitter, it is possible to display colors by constructing one picture element of three dots, being an emission unit capable of developing a red color, an emission unit capable of developing a green color, and an emission unit capable of developing a blue color, and it is preferable that a ratio of numerical apertures of the emission units satisfies the following equation (2).

$$a_r:a_g:a_b = 1:3 \text{ to } 8:8 \text{ to } 15 \qquad \text{equation (2)}$$

Where $a_r$ is the numerical aperture of the emission unit capable of developing a red color, $a_g$ is the numerical aperture of the emission unit capable of developing a green color, and $a_b$ is the numerical aperture of the emission unit capable of developing a blue color.

A method of designing the brightness of an emitter of the present invention is a method of designing the brightness of an emitter comprising a plurality of types of emission units with different emission aging characteristics, wherein an initial value determination process is performed to set initial brightnesses of the emission units such that a skew of emission life between the emission units is within 20%.

In the method of designing the brightness of an emitter, it is preferable to perform a numerical aperture determination process for determining a numerical aperture for each type of the abovementioned emission units based on the determined initial values.

Furthermore, in the method of designing the brightness of an emitter, it is preferable to perform a usage range determination process for determining the range of current values or voltage values used for each type of the abovementioned emission unit based on the determined initial values.

Moreover, in the method of designing the brightness of an emitter, it is preferable that the emission life of the emission units is defined as the time required until the emission brightness reaches a prescribed percentage of the initial brightness. In this case, it is preferable that the prescribed percentage is 50%.

Furthermore, in the method of designing the brightness of an emitter, it is possible to display colors by constructing one picture element of three dots, being an emission unit capable of developing a red color, an emission unit capable of developing a green color, and an emission unit capable of developing a blue color, and it is preferable that numerical apertures of the emission units satisfy the above-described equation (1).

Moreover, another method of designing the brightness of an emitter of the present invention is a method of designing the brightness of an emitter comprising a plurality of types of emission units with different emission aging characteristics, which performs an initial value determination process and a numerical aperture determination process for setting initial brightnesses and numerical apertures of the emission units such that a skew of emission intensity between the emission units is within 20% over a prescribed time.

In the method of designing the brightness of an emitter, it is preferable that the skew of the emission intensity between the emission units over a prescribed time is determined based on a normalized decay curve obtained by dividing a decay curve of the emission brightness of each of the emission units by the initial brightness of the emission brightness.

A program for designing the brightness of an emitter of the present invention is a program for designing the brightness of an emitter comprising a plurality of types of emission units with different emission aging characteristics, wherein an initial value determination process is performed by computer to set initial brightnesses of the emission units such that a skew of emission life between the emission units is within 20%.

In the program for designing the brightness of an emitter, it is preferable that a numerical aperture determination process is performed by computer to determine a numerical aperture for each type of the emission units based on the determined initial values.

Furthermore, in the program for designing the brightness of an emitter, it is preferable that a usage range determination process is performed by computer to determine a range of current values or voltage values used for each type of emission unit based on the determined initial values.

Moreover, in the method of designing the brightness of an emitter, it is preferable that the emission life of the emission units is defined as the time required until the emission brightness reaches a prescribed percentage of the initial brightness. In this case, it is preferable that the prescribed percentage is 50%.

Furthermore, in the program for designing the brightness of an emitter, it is possible to display colors by constructing one picture element of three dots, being an emission unit capable of developing a red color, an emission unit capable of developing a green color and an emission unit capable of developing a blue color, and it is preferable that numerical apertures of the emission units satisfy the above equation (1).

Moreover, another program for designing the brightness of an emitter of the present invention is a program for designing the brightness of an emitter comprising a plurality of types of emission units with different emission aging characteristics, wherein an initial value determination process and a numerical aperture determination process are performed by computer to set initial brightnesses and numerical apertures of the emission units such that a skew of emission intensity between the emission units is within 20% over a prescribed time.

In the method of designing the brightness of an emitter, it is preferable that the skew of the emission intensity between the emission units over a prescribed time is determined based on a normalized decay curve obtained by dividing the decay curve of the emission brightness of each of the emission units by the initial brightness of the emission brightness.

An electrooptical device of the present invention is provided with the above-described emitter as a display device.

An electric(electronic) device of the present invention is provided with the above-described emitter as a display device.

In the above-described invention, the emitter is applicable to an organic electroluminescence display, an inorganic electroluminescence display, a plasma display (PDP), a field emission display (FED), and the like. In particular, it is preferable to apply it to an organic electroluminescence display (organic EL).

For the emission aging characteristics of an EL element (emission unit), an investigation of the decay curve (curve showing the change of emission brightness over elapsed usage time under conditions where a constant current flows in the case of constant current drive, and under conditions where a constant voltage is applied in the case of constant voltage drive) of the emission brightness proved that if a sufficiently long time is considered, then the initial value of the emission brightness, that is, the initial brightness, has a great influence on the shape of the decay curve. This is because if the emission brightness is set high, the integrated value (in the case of constant current drive) of current flowing into an emission material, or the integrated value (in the case of constant voltage drive) of voltage applied to the emission material reaches a high value in a comparatively short time, and conversely, if the emission brightness is set low, the integrated values of the current value and voltage value do not reach high values unless a comparatively long time has elapsed. That is, these integrated values and the deterioration process of the emission material are intimately associated.

Here, the initial value of emission brightness (initial brightness) means a value that can express the intensity of emission brightness. For example, it may be an average value of emission brightness, or may be the maximum value of emission brightness.

In the emission of the invention, the initial brightnesses of the emission units, that is, the initial average values, maximum values or the like of the emission brightnesses, are set such that the skew of emission life between the emission units is within 20%.

Furthermore, in a method of designing brightness and a program for designing the brightness of an emitter of the invention, the initial brightnesses of the emission units, that is, the initial average values, maximum values or the like of the emission brightnesses, are set such that the skew of emission life between the emission units is within 20%. Then, based on these determined initial values, a numerical aperture for each type of emission unit is determined, and moreover, based on these determined initial values, a range of current values (in the case of constant current drive) or voltage values (in the case of constant voltage drive) used is determined for each type of emission unit.

Here, the reason to make the skew of emission life between emission units within 20% is that if it is within 20%, then the white balance obtained by setting each numerical aperture appropriately is within tolerance over the emitter life, and is within a range that does not damage the merchandisable value.

The range of current values or voltage values used can be defined by the minimum and maximum values. However, in a case where the minimum is 0 amperes or 0 volts, it is also possible to define it by only the maximum or the median. The current value or the voltage value when there is no emission (that is, the minimum) is normally 0 amperes or 0 volts, so that it is most natural and easiest to define the range of current values or voltage values used by a single maximum or median value.

If the actual current values and voltage values are controlled based on the range of such current values and voltage values used, then the actual decay curve of emission brightness of each of the EL elements (emission units) almost coincides with the decay curve determined by the initial value (initial brightness) determined by the initial value determination process.

Regarding the initial value of emission brightness (initial brightness) for each type of the EL elements (emission units), since each of the initial brightnesses is set such that the skew of emitter life between EL elements (emission units) is within 20%, the deterioration process of each of the EL elements (emission units) is almost equal.

The initial value of emission brightness (initial brightness) is determined by the initial value determination process, considering as a priority that the skew of life between EL elements (emission units) must be within 20%. Since a numerical aperture is determined for each type of EL element (emission unit) in the numerical aperture determination process, based on this initial value (initial brightness), it is possible to make the brightness ratio between the EL elements (emission units) a required condition (for example, a white balance capable of obtaining pure white).

Furthermore, based on the above initial value (initial brightness), it is possible to determine the range of current values (in the case of constant current drive) or voltage values (in the case of constant voltage drive) used for each of the EL elements in the usage range determination process.

Moreover, it is possible to display colors by providing each picture element with EL elements (emission units) of three colors: an EL element (emission unit) capable of developing a red color; an EL element (emission unit) capable of developing a green color; and an EL element (emission unit) capable of developing a blue color, such that one picture element is made up of the three primary colors, red (R), green (G), and blue (B). In this case, if the numerical apertures of the above EL elements (emission units) satisfy the above-described equation (1), then it is possible to obtain appropriate white balance, whatever the value of the initial value (initial brightness) of the emission brightness determined by the initial value determination process.

Furthermore, in the aforementioned invention, by setting the emission life of each of the EL elements (emission units) to the usage time required for the emission brightness to deteriorate to a prescribed percentage of the initial brightness (emission brightness obtained immediately after manufacture), the skew of emission life between the EL elements (emission units) is within 20%. That is, when a certain usage time has elapsed, if the percentage deteriorations of the emission brightness of each of the EL elements (emission units) are equal, even if the brightness as a whole is reduced, the brightness ratio is the same as in the initial condition. Therefore, in a case where numerical apertures are set so as to obtain a required white balance for example, even if the emission brightnesses of EL elements (emission units) are reduced after a certain usage time has elapsed, it is possible to maintain the required white balance.

Here, by making the prescribed percentage 50%, even when the emission brightness of the EL elements (emission units) deteriorates to half of the initial value, it is possible to maintain the initial brightness ratio between the EL elements (emission units), and maintain the required white balance.

Moreover, in an emitter of the present invention, the initial brightnesses and numerical apertures for the emission units are set such that the skew of emission intensity between the emission units is within 20% over a prescribed time.

The reason to make the skew of emission intensity between emission units within 20% over a prescribed time is that if it is within 20%, then the white balance obtained by setting each numerical aperture appropriately is within tolerance over the predetermined time, and is within a range that does not damage the merchandisable value.

Furthermore, it is preferable that the skew of the emission intensity between the emission units over a prescribed time is determined based on a normalized decay curve obtained by dividing the decay curve of the emission brightness of each of the emission units by the initial brightness of the emission brightness. This is because if the skew between the normalized decay curves of the EL elements (emission units) is small, then it is possible to maintain the brightness ratio in a condition close to the initial condition even in a process in which emission brightness is reduced, so that the brightness ratio can be maintained in comparatively good condition over a long time. Here, the skew between normalized decay curves can be determined by using, for example, the least-squares method. Furthermore, the required time is set by an appropriate standard, and a time corresponding to (almost coinciding with) the guarantee period of a product obtained can be used, for example.

Here, for a skew between normalized decay curves, if the skew between normalized decay curves until the EL elements (emission units) reach end of life is used, it is possible to maintain the brightness ratio in a comparatively good condition over their whole life.

Furthermore, the emitters of the inventions as described above are ideal for display devices, and accordingly, electrooptical devices and electric devices in which they are installed are especially good.

As described above, according to the present invention, it is possible to almost equalize the deterioration (aging) of emission characteristics of each of the emission units, and it is possible to maintain the brightness ratio between the emission elements in a good condition over a long period accordingly.

DETAILED DESCRIPTION OF THE PREFERRED EMBODIMENTS

Hereunder is a description of embodiments of the present invention based on the drawings.

[Embodiment 1]

In the present embodiment, the present invention is used as an EL device (emitter) for a display device (organic EL display device), wherein color display is possible by constructing one picture element of three dots, being an organic EL element (emission unit) capable of developing a red color, an organic EL element (emission unit) capable of developing a green color and an organic EL element (emission unit) capable of developing a blue color.

Figure 1:
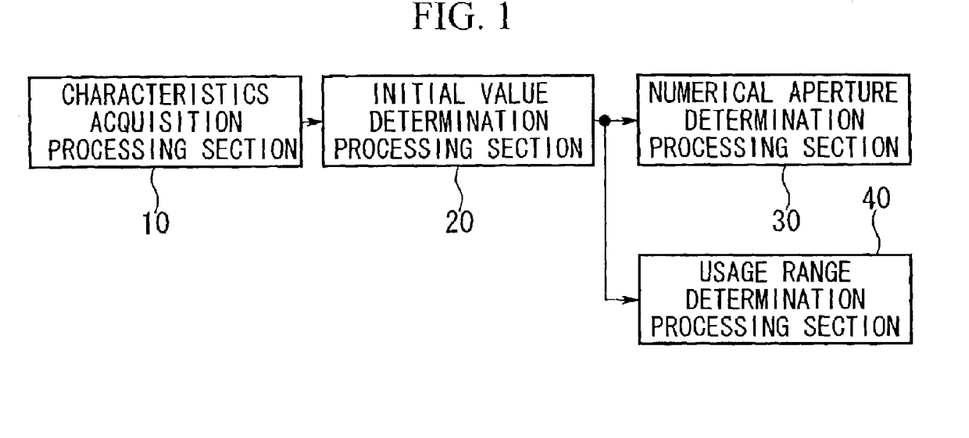
FIG. 1 is a block diagram showing the functional structure of a design program in an embodiment of the present invention.

FIG. 1 is a block diagram showing the functional structure of a design program of an organic EL display device of the present embodiment, and this design program is executed in a normal computer.

That is, this design program, if separated into functional blocks, comprises: a characteristics acquisition processing section 10 for acquiring the relationships between the initial brightness (initial value of emission brightness) of each color of an organic EL element, and the lifetime of the organic EL element; an initial value determination processing section 20 for determining the initial value of emission brightness (initial brightness) of the organic EL elements such that the lifetimes of organic EL elements used for the organic EL display device being designed are equalized, based on the relationship between the initial brightness of each color of an organic EL element and the lifetime, that is, such that the skew of emission lifetime between the organic EL elements is within 20%; a numerical aperture determination processing section 30 for determining a numerical aperture for each emission color of the organic EL element based on the determined initial values and the brightness ratio of the colors to display white; and a usage range determination processing section 40 for determining the median current value (in the case of constant current drive), or the median voltage value (in the case of voltage drive), for each emission color of an organic EL element, based on the initial value determined.

Figure 2:
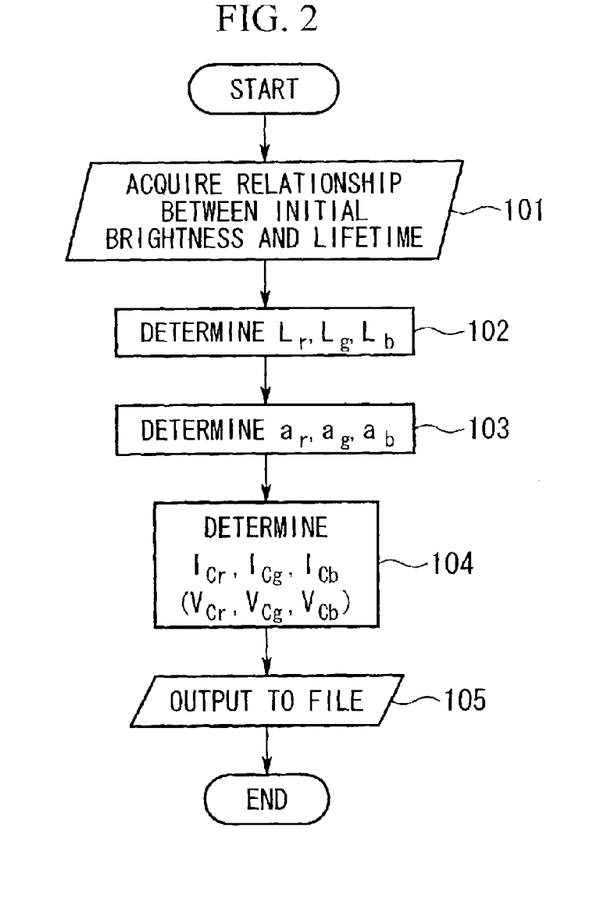
FIG. 2 is a flow chart showing an outline of the design program processes.

FIG. 2 is a flow chart showing an outline of the processes during the execution of the design program. Hereunder is a further detailed description of the present embodiment with reference to FIG. 2.

When the design program starts, firstly in step 101, the relationship between initial brightness and lifetime is obtained for each type of emission material used for an organic EL display device, being a design object.

In the present embodiment, regarding the relationship between initial brightness and emission aging characteristics (lifetime) for each emission material used for an organic EL element, a plurality of results measured in advance is stored on a hard disc on a computer, and in step 101, a process is executed for reading the stored relationships between initial brightness and aging (lifetime).

Figure 3:
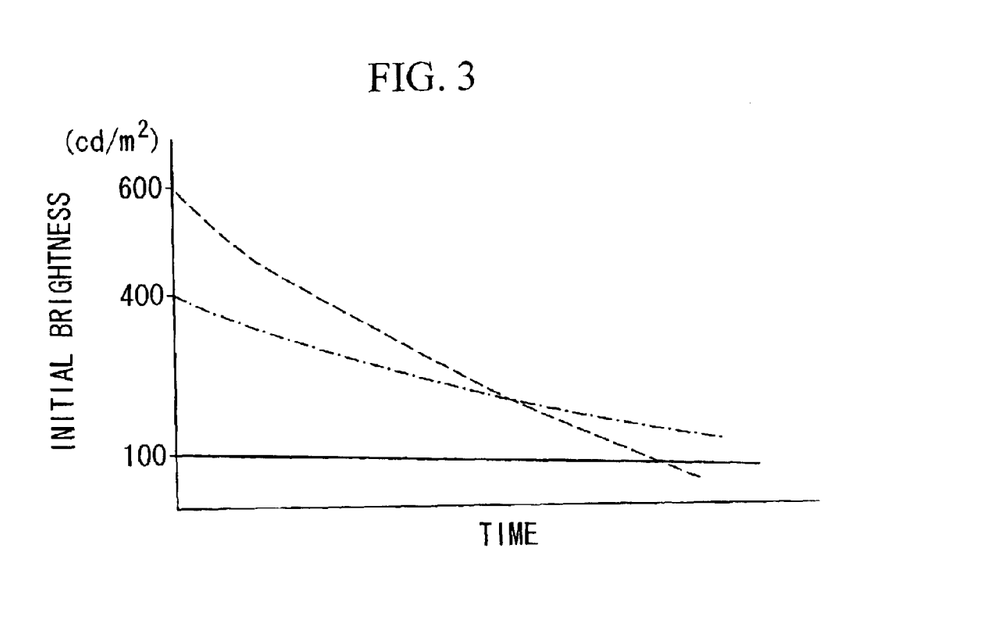
FIG. 3 is a graph showing an example of a relationship between initial brightness and lifetime.

Here, as shown in FIG. 3, although the same emission material is used, if the initial brightness is set high (for example, 600 cd/m$^2$) and the current or voltage at which the initial brightness is obtained continues to be applied, the emission brightness declines significantly within a comparatively short time, even though the same current or voltage value is applied. However, if the initial brightness is set around medium (for example, 400 cd/m$^2$), and the current or voltage at which the initial brightness is obtained continues to be applied, the decay curve of the emission brightness becomes shallower than in the case where the initial brightness is set high. Furthermore, if the initial brightness is set low (for example, 100 cd/m$^2$), and the current or voltage at which the initial brightness is obtained continues to be applied, the emission brightness declines only slightly even after a comparatively long time has elapsed.

Incidentally, such a relationship between initial brightness and emission aging (lifetime) characteristics differs with each emission material. Therefore, by only equalizing the RGB brightness ratio so as to obtain white balance at the time of initial brightness, when a certain time has elapsed, the initial brightness ratio is lost, so that the white balance cannot be obtained.

Control proceeds from step 101 to step 102. Here, based on the characteristics of each emission material obtained in step 101 as shown in FIG. 3, the initial value determination process section 20 obtains initial brightnesses $L_r$, $L_g$, and $L_b$, with which the time (half life) required for the emission brightness to reach a prescribed percentage (50% in this example) of the initial brightness is 1000 hours in the case where the emitter emits light continuously with the same current value or voltage value, for each emission material. That is, as shown in FIG. 3 for example, since the shapes of the decay curves of the emission materials differ significantly depending on the value of initial brightness, by selecting the value of the initial brightness appropriately, it is possible to obtain an initial brightness for each color with which the half life is 1000 hours. As a result, in the initial value determination process section 20, initial brightnesses are obtained for each color, for example $L_r$=800 cd/m²
$L_g$=800 cd/m²
$L_b$=150 cd/m²

Here, initial brightnesses with which the half life is 1000 hours are obtained. However, the time of the set half life is not limited to 1000 hours, and an appropriate time, for example a time corresponding to (coinciding with) the guarantee period of the final product can be used.

When an initial brightness has been obtained for each color in step 102, control proceeds to step 103 where, considering the emission spectrum for each of the colors, RGB, and based on the initial brightnesses for each color, $L_r$, $L_g$ and $L_b$, obtained in step 102, numerical apertures for each color, $a_r$, $a_g$ and $a_b$, in one picture element are calculated by the following equation.

$$a_r:a_g:a_b = W_r L_g L_b : W_g L_r L_b : W_b L_r L_g$$

Here, $a_r$ is the numerical aperture of an EL element capable of developing a red color, $a_g$ is the numerical aperture of an EL element capable of developing a green color, and $a_b$ is the numerical aperture of an EL element capable of developing a blue color.

Furthermore, $W_r:W_g:W_b$ is the brightness ratio ($W_r$ corresponds to red, $W_g$ green, and $W_b$ blue) of all of the colors to display a white color in one picture element, which is set based on the emission spectrums of each of the RGB colors.

For example, in the case of a chromaticity of R (0.67, 0.33), G (0.35, 0.6), B (0.15, 0.16), in order to display white (0.33, 0.33), the RGB brightness ratio of, $W_r:W_g:W_b$ is 1:8:2, so that by substituting the brightness ratio and the initial brightnesses for each color, $L_r$, $L_g$ and $L_b$, in the above equation, the numerical apertures for each color, $a_r$, $a_g$ and $a_b$, can be obtained.

Incidentally, if $L_r$=800 cd/m², $L_g$=800 cd/m², $L_b$=150 cd/m², and $W_r:W_g:W_b$=1:8:2 are substituted in the above equation, $$a_r:a_g:a_b = 15:120:160.$$

If these numerical values are expressed as percentages, and designated as numerical apertures, then the numerical aperture of red is 1.5%, the numerical aperture of green is 12%, and the numerical aperture of blue is 16%. The emission brightness of a whole picture element (emission brightness not for a unit area, but for a whole picture element) in this case is obtained by $L_r \times 0.015 + L_g \times 0.12 + L_b \times 0.16$, and if the numerical values are substituted, then it becomes 132 cd/m².

If the above numerical apertures (numerical apertures for each picture element) are converted into numerical apertures for each dot (sub pixel), then each is tripled, red being 4.5%, green being 36%, and blue being 48%. Accordingly, they are values close to the numerical apertures obtained by a TFT (thin film transistor) substrate used in a current organic EL display device. Furthermore, although an area of one picture element divided equally into three dots is not sufficient for blue because its numerical aperture is large, a satisfactory implementation is possible by allocating an area of red with a small numerical aperture relative to blue.

When processing in step 103 is completed, control proceeds to step 104, and based on the initial brightnesses for each color, $L_r$, $L_g$ and $L_b$, obtained in step 102, median current values $Ic_r$, $Ic_g$ and $Ic_b$ (in the case of constant current drive) or median voltage values $Vc_r$, $Vc_g$ and $Vc_b$ (in a case of voltage drive) are determined for each color when in use.

For example, in the case of constant current drive, a large current or a small current flows into each organic EL element according to emission brightness. However, if a sufficiently long time (for example, 1000 hours) is considered, it can be considered that the same median (normally half of the maximum current value) of the maximum current value and the minimum current value (normally 0 ampere) continue to flow on average. Accordingly, in the case of the example shown in FIG. 3, "initial brightness" on the vertical axis can be designated as the "median current value", and the emission brightness decays with the same trend as the "median current value". The same is true in the case of constant voltage drive.

Accordingly, in step 104, the current values or voltage values required to obtain the initial brightnesses $L_r$, $L_g$ and $L_b$ may be set as the median current values $Ic_r$, $Ic_g$ and $Ic_b$, or the median voltage values $Vc_r$, $Vc_g$ and $Vc_b$.

When processing in step 104 is completed, control proceeds to step 105, where the values determined in steps 102 to 104 are output to a file assigned by a user, and the processing in FIG. 2 is completed.

Then, using an organic EL display device designed after passing through the above processing, since the decay (aging) of the emission brightness of organic EL elements (emission units) is equalized for each color, there is an advantage that even if the usage time reaches around 1000 hours, white balance is not lost.

Here, in the present embodiment, the design is such that the times until the emission brightnesses reach 50% of the initial brightnesses are coincident for all organic EL elements. However, it is not limited to 50%, and other percentages may be used. Furthermore, it is not designed such that the organic EL elements are coincident, but the initial brightnesses of each of the above organic EL elements may be set (designed) such that the skew of emission lifetime between organic EL elements is within 20%.

[Embodiment 2]

Next is a description of a second embodiment of the present invention.

In the present embodiment, similarly to the first embodiment as described above, the present invention is used as an EL device (emitter) for a display device (organic EL display device), wherein color display is possible by constructing one picture element of three dots, RGB.

However, in the present embodiment, the times required until the emission brightnesses of the organic EL elements (emission units) drop to a value of a prescribed percentage (for example, 50%) of the initial brightnesses are not equalized, but, considering a point of time when the emission brightness of a color organic EL element drops to a value of a prescribed percentage (for example, 50%) of the initial brightness, the design is such that the emission brightnesses of all of the colors decay with as close to the same trend as possible until the usage time reaches this point of time.

Here, since a large proportion of the design program process of the present embodiment is the same as in the case of the first embodiment as described above, the content of the design program of the present embodiment will be described using FIG. 2.

In the present embodiment also, after passing through step 101, control proceeds to step 102, and the initial brightnesses $L_r$, $L_g$ and $L_b$ are determined. However, the content of the process in step 102 is a little different from the first embodiment.

Figure 4:
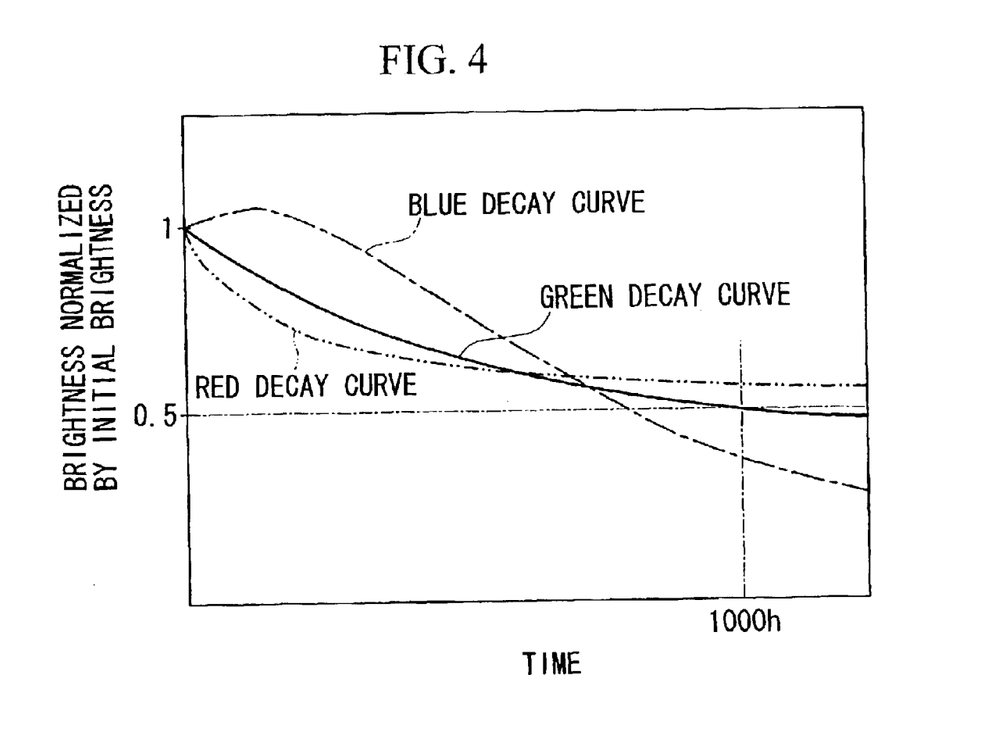
FIG. 4 is a graph showing an example of normalized decay curves.

That is, when control proceeds to step 102, firstly, by dividing each of the decay curves of the RGB colors by their initial brightnesses, normalized decay curves (brightness normalized by initial brightness) are obtained as shown in FIG. 4, and a decay curve exhibiting the required trend (the closest decay trend to a declining straight line) is selected from among those normalized decay curves. In the case of the example of FIG. 4, the green decay curve is selected.

Next, based on the green normalized decay curve, a point of time when the emission brightness of the green organic EL element drops to a prescribed percentage (for example 50%) of the initial brightness is designated as the point of time that the green organic EL element reaches end of life. Such a point of time may be set as 1000 hours for example.

Then, the initial brightness $L_r$ of the red organic EL element is obtained, being that at which the skew between the normalized decay curve of the green organic EL element and the normalized decay curve of the red organic EL element is a minimum over the time until 1000 hours, obtained as above, is reached. Similarly, the initial brightness $L_b$ of the blue organic EL element is obtained, being that at which the skew between the normalized decay curve of the green organic EL element and the normalized decay curve of the blue organic EL element is a minimum over the time until 1000 hours, obtained as above, is reached.

In the case where ideal initial brightnesses $L_r$ and $L_b$ can be obtained, they are fixed along with the initial brightness $L_g$ in the decay curve of the green organic EL element used when determining the skew, bringing a conclusion to step 102. However, in the case where initial brightnesses $L_r$ and $L_b$ with small skews cannot be obtained, the initial brightness of the green organic EL element is altered appropriately to obtain a normalized decay curve, and then the initial brightnesses $L_r$ and $L_b$ may be obtained again.

Here, determining the magnitude of the skew between the normalized decay curves can also be performed by comparing time integrals during the 1000 hours obtained as above, or it can be performed using the least-squares method. However, in the case of determining the magnitude of the skew using time integrals, when there are few types of relationship between the initial brightness and lifetime acquired in step 101, then based on two time integrals of red either side of the time integral of green, the initial brightness of red coinciding with the time integral of green may be obtained by interpolation.

Then, in step 101, initial brightnesses are obtained for each color, for example, $L_r$=700 cd/m$^2$
$L_g$=900 cd/m$^2$
$L_b$=110 dc/m$^2$ Here, if the initial brightnesses $L_r$, $L_g$ and $L_b$ obtained in step 102 are the values described above, and the RGB brightness ratio $W_r:W_g:W_b$=1:8:2, then the numerical apertures $a_r$, $a_g$ and $a_b$ are $a_r:a_g:a_b$=99:616:1260≈1:6:13.

By appropriate scaling, the numerical aperture of red becomes 2%, the numerical aperture of green becomes 12%, and the numerical aperture of blue becomes 26%. The emission brightness of the whole of one picture element in this case is obtained by $L_r0.02+L_g\times0.12+L_b\times0.26$, which is 150.6 cd/m$^2$ if numerical values are substituted.

Here, from the numerical apertures obtained in this manner, and furthermore the numerical apertures obtained in the embodiment described previously, in an emitter of the present invention it is particularly preferable to make the ratio of numerical apertures between the EL elements lie within the range in the following equation.

$a_r:a_g:a_b$=1:3 to 8:8 to 15

If the RGB brightness ratio is in this range, the white balance obtained is good, and furthermore this good white balance can be maintained until the end of life of an EL device (emitter).

If the above numerical apertures (numerical apertures for each picture element) are converted into numerical apertures for each dot (sub pixel), then each is tripled, red being 6%, green being 36%, and blue being 78%, and on average they are values close to the numerical apertures of a current TFT substrate. Therefore, a satisfactory implementation is possible by reallocating an area of red to blue for the insufficient portion of blue.

When the processing in step 102 is completed, control proceeds to step 103. The processing after step 103 is the same as in the first embodiment, so the description is omitted.

Using an organic EL display device designed after passing through the above processing, since normalized decay curves of the emission brightness of organic EL elements are obtained for each color, the initial brightness of each organic EL element is obtained such that the skew between those normalized decay curves becomes small, and furthermore since numerical apertures and a median current value or a median voltage value are determined, there is an advantage in that a better white balance can be obtained than conventionally even in a process in which the emission brightness of each organic EL element decays gradually.

In the present embodiment, the time when emission brightness reaches 50% of the initial brightness designates the lifetime of an organic EL element. However, it is not limited to 50%, and may be a different percentage.

Next is an example of an organic EL display device (emitter) designed in this manner.

Figure 5:
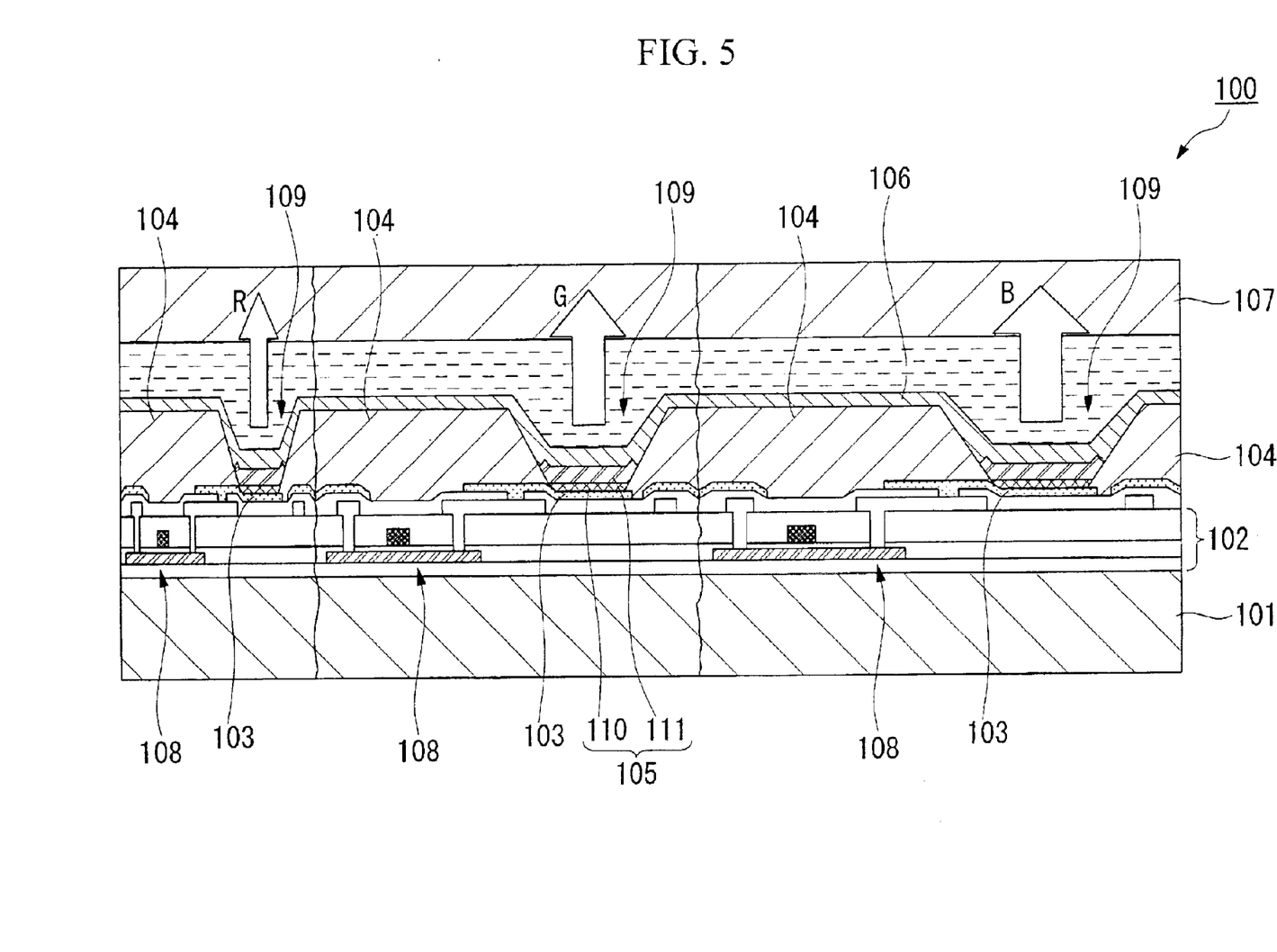
FIG. 5 is a sectional side elevation schematically showing an example of a bottom emission type organic EL display device.

FIG. 5 is a sectional side elevation schematically showing an example of a so-called bottom emission type organic EL display device, which emits light on the side of a substrate on which a drive element is formed. An organic EL display device (emitter) 100 as shown in FIG. 5 comprises a substrate 101, a circuit element section 102, an opposing electrode 106 (cathode), and a sealing layer 107, and furthermore a flexible wiring board (omitted in the figure) and a drive IC (omitted in the figure) are connected.

The substrate 101 must be translucent because the organic EL display device 100 is a bottom emission type. For example, a glass plate with a thickness of about 0.5 mm is used ideally.

The circuit element section 102 is constructed such that drive elements (active elements) 108 made of TFTs or the like are formed on the substrate 101, and a plurality of picture element electrodes 103 is formed in a prescribed pattern on this circuit element section 102. The picture element electrodes 103 are translucent electrodes made of ITO or the like, which enable light from light emitting diodes 105 to be transmitted through the picture element electrodes 103.

Bank sections 104 made, for example, of acrylic resin or the like, are formed between picture element electrodes 103, and the light emitting diodes 105 are formed in concave openings 109 formed by the bank sections 104. The aforementioned drive elements 108, their wiring and the like are formed so as to be positioned immediately under the bank sections 104, which prevents these drive elements 108 and the like from interfering with light leaving the light emitting diodes 105.

In the present example, each light emitting diode 105 is provided with a hole injection layer 110 formed on the picture element electrode 103, and a luminescent layer 111 formed on top of this. It comprises a light emitting diode (emission unit) 105R, which develops a red color (R), a light emitting diode (emission unit) 105G, which develops a green color (G), and a light emitting diode (emission unit) 105B, which develops a blue color (B), and performs color display by using these three dots as one picture element. An electron injection layer may be formed on the luminescent layer 11 as required, and included in the light emitting diode 105.

The opposing electrode (cathode) 106 is formed covering all of the top of the bank section 104 and the light emitting diode 105, and is formed from LiF, Ca and Al in this order. In this opposing electrode 106, the top layer of Al also functions as a reflective film that reflects light from the light emitting diode 105.

On the opposing electrode 106 that is formed in this manner, a sealing layer 107 made of glass or the like is attached by sealing resin (not shown in the figure).

In an organic EL display device 100 with such a construction, the numerical apertures of the light emitting diodes 105 are determined, for example, by the opening on the bottom side of the concave opening 109, that is the area where the hole injection layer 110 touches the picture element electrode 103. This area (numerical aperture) is set by determining a ratio of numerical apertures for the light emitting diodes (emission units) 105 in a range, for example, as shown in the above equation (2), that achieves a good white balance with the preset initial brightnesses of the light emitting diodes (emission units) 105. That is, for the white balance determined by this numerical aperture ratio, a ratio that results in a brightness in an ideal range for a display device is obtained, and by multiplying the percentages in the ratio of the numerical apertures determined previously, an opening area (numerical aperture) is determined which enables an ideal brightness as a display device to be obtained while maintaining the above white balance.

Figure 6:
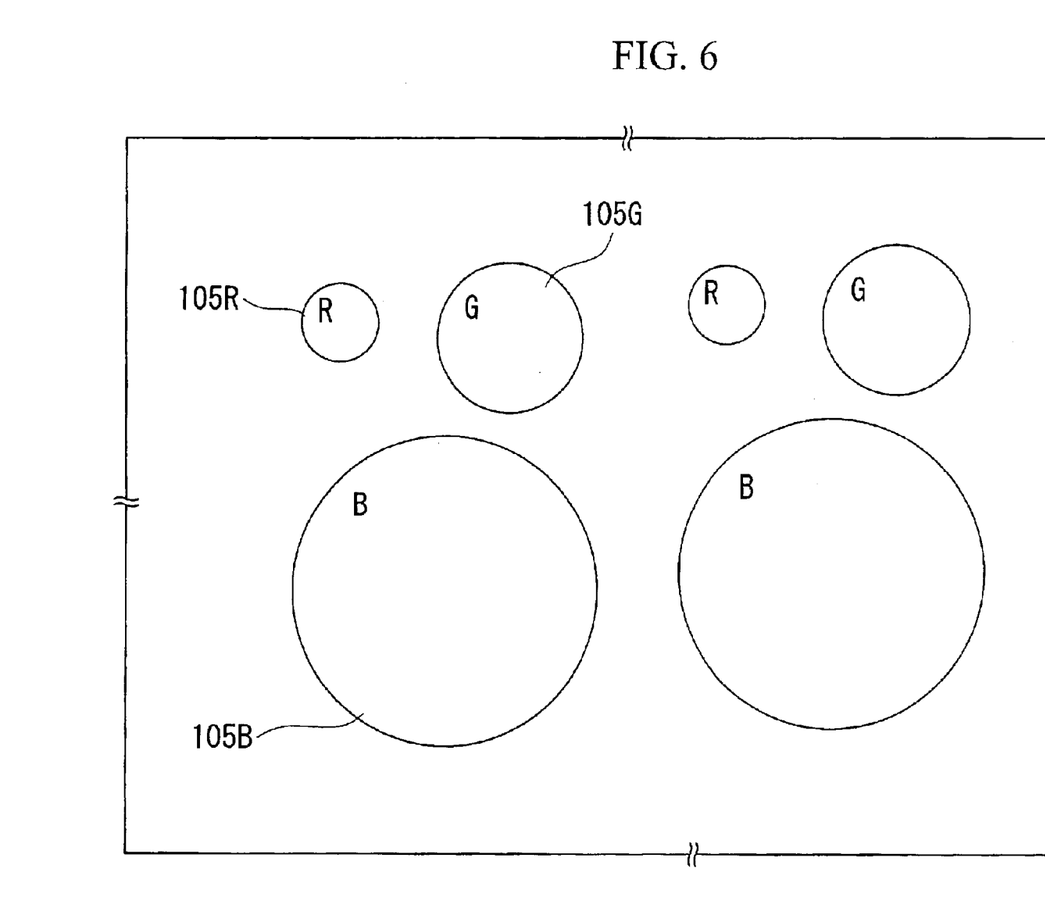
FIG. 6 is a plan view schematically showing an arrangement of emission units and the ratio of numerical apertures.

Furthermore, the arrangement of the light emitting diodes (emission units) 105 and the ratio of the numerical apertures are as shown in FIG. 6, for example. That is, since the numerical aperture of the B (blue) light emitting diode (emission unit) 105B is larger than those of the R (red) light emitting diode (emission unit) 105R and the G (green) light emitting diode (emission unit) 105G, the numerical apertures (opening areas) are enlarged as shown in FIG. 6. Moreover, the R (red) light emitting diode (emission unit) 105R and the G (green) light emitting diode (emission unit) 105G are placed on one side of the B (blue) light emitting diode (emission unit) 105B so as to maintain all of the numerical apertures with as little fragmentation as possible.

Figure 7:
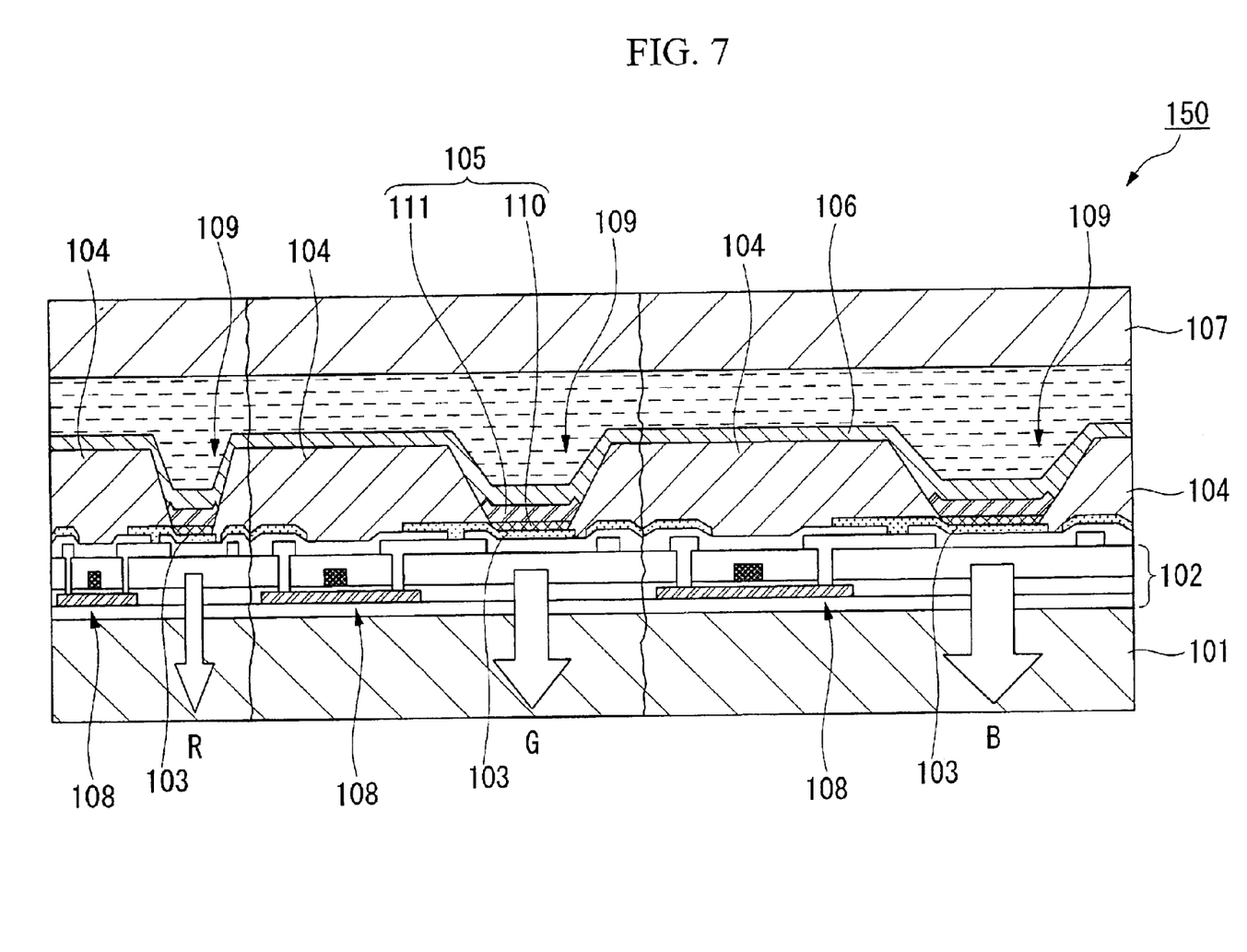
FIG. 7 is a sectional side elevation schematically showing an example of a top emission type organic EL display device.

FIG. 7 is a sectional side elevation schematically showing an example of a so-called top emission type organic EL display device (emitter), which emits light on the sealing layer 107 side. The points of difference of the organic EL display device (emitter) 150 shown in FIG. 7 from the organic EL display device (emitter) 100 shown in FIG. 5 are that a substrate made of metal, resin or the like, which is not translucent, can be used for the substrate 101, that translucent material is used for the opposing electrode 106, and that translucent material is also used for the sealing layer 107. Here, specifically, a reflective electrode is used for the picture element electrode 103, or it is preferable to make a layered structure in which a translucent electrode is provided with a reflective layer such as Al or the like.

In this example, the numerical apertures (opening areas) of each of the light emitting diodes 105 are determined, for example, by the openings on the top side of the concave openings 109, that is, the area where the luminescent layer 111 touches the opposing electrode 106.

In such an organic EL display device 150, the arrangement of the light emitting diodes (emission units) 105 and the ratio of the numerical apertures are also as shown in FIG. 6.

Furthermore, since this organic EL display device 150 is a top emission type, the structure is different from that shown in FIG. 7, and the drive element 108, the wiring and the like do not need to be formed immediately under the bank section 104 but can be located arbitrarily. In other words, the arrangement of the light emitting diodes (emission units) 105, and the numerical apertures (opening area) can be set regardless of the location of the drive elements 108, the wiring and the like. Accordingly, the degree of design freedom is increased, and the numerical apertures (opening areas) can be enlarged compared with a bottom emission type.

An electrooptical device of the present invention is provided with the above-described emitter as a display device. To be specific, other than the aforementioned organic electroluminescence display (organic EL display device), there are inorganic electroluminescence displays, plasma displays (PDP), field emission displays (FED) and the like.

[Embodiment 3]

Figure 8:
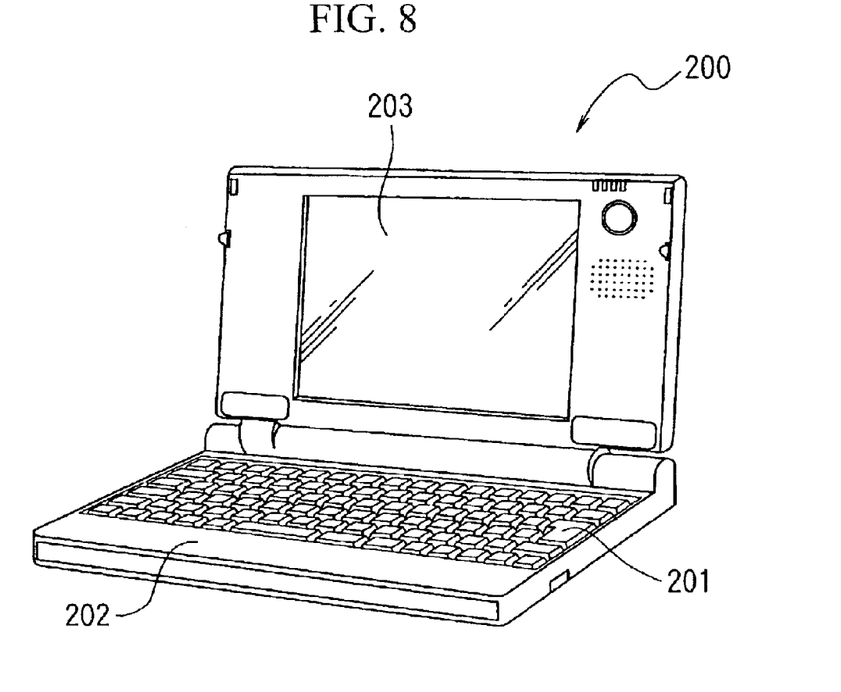
FIG. 8 is a perspective view showing a mobile type personal computer as an example of an electric device in which an organic EL display device of the present invention is installed.

FIG. 8 is a perspective view showing a mobile type personal computer as an example of an electric device in which an organic EL display device (emitter) of the present invention is installed.

The mobile type personal computer 200 is provided with a main body 202 incorporating a keyboard 201, and a display unit 202 comprising an organic EL display device (emitter) according to the first or second embodiments.

[Embodiment 4]

Figure 9:
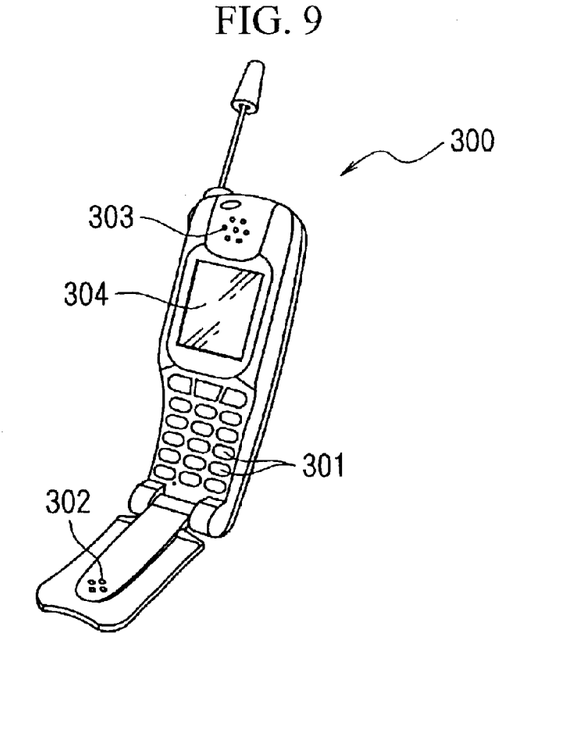
FIG. 9 is a perspective view showing a mobile telephone as an example of an electric device in which an organic EL display device of the present invention is installed.

FIG. 9 is a perspective view showing a portable telephone as an example of an electric (electronic) device in which an organic EL display device (emitter) of the present invention is installed.

The portable telephone 300 is provided with a plurality of operation buttons 301, an earpiece 302, a mouthpiece 303, and an organic EL display device (emitter) 304 according to the first or second embodiments.

[Embodiment 5]

Figure 10:
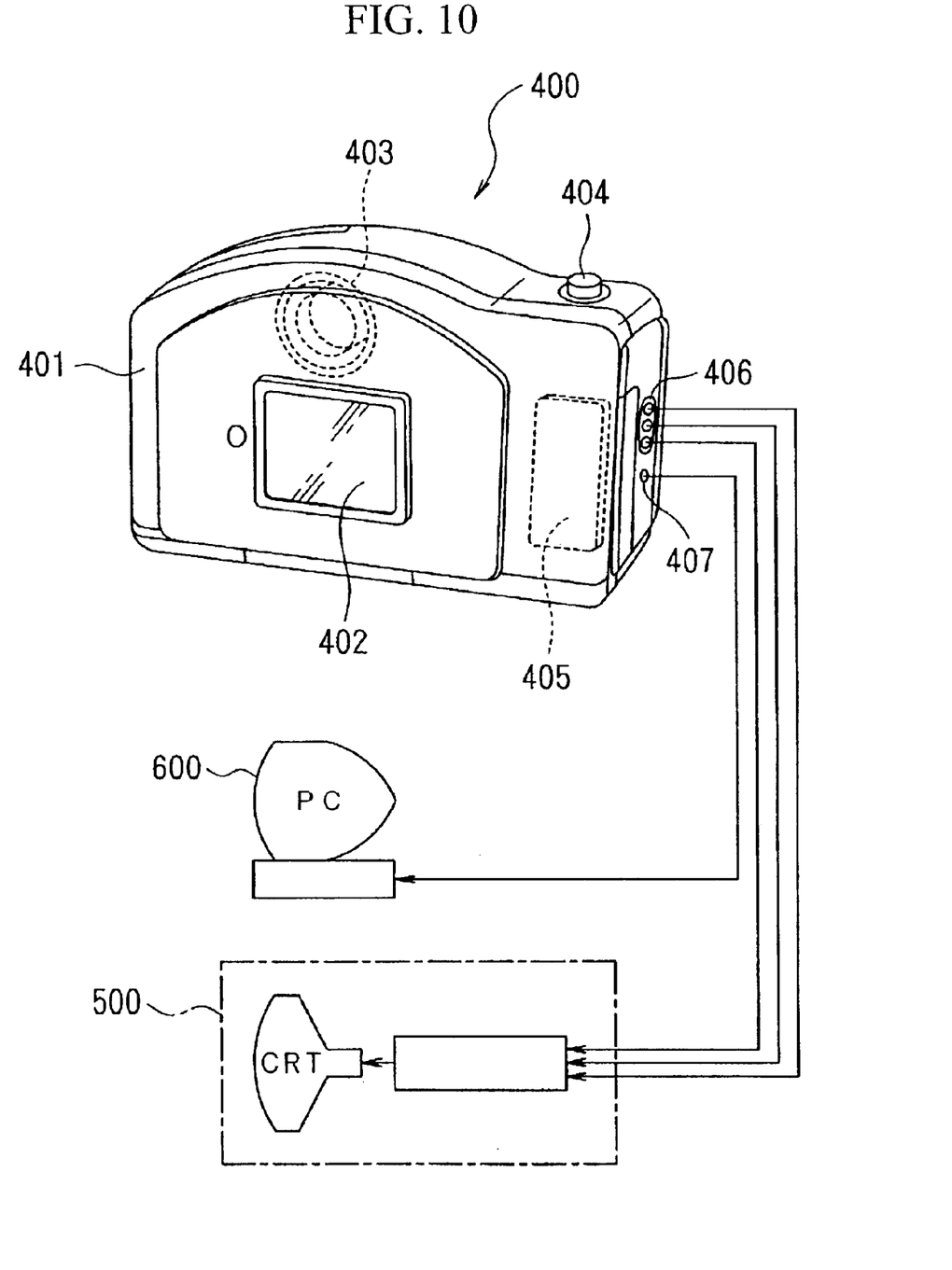
FIG. 10 is a perspective view showing a digital still camera as an example of an electric device in which an organic EL display device of the present invention is installed.

FIG. 10 is a perspective view showing a digital still camera as an example of an electric device in which an organic EL display device (emitter) of the present invention is installed. Here, simple connections with external equipment are shown.

The digital still camera 400 is provided with a case 401, a display panel 402 installed on its back, which is made of an organic EL display device (emitter) according to the first or second embodiments, a light detecting unit 403 containing an optical lens and a CCD (Charge Coupled Device) or the like, which is installed on the observing side (rear side in the figure) of the case 401, a shutter button 404, and a circuit substrate 405 to which an image signal from the CCD is transferred and stored in at the point of time that the shutter button is pressed. Display is performed on this display panel 402 based on the image signal generated by photoelectric exchange by an image element such as a CCD or the like.

Furthermore, this digital still camera 400 is provided with a video signal output terminal 406 and a data communication input output terminal 407 on the side of the case 401. If required, as shown in the figure, a television monitor 500 is connected to the former (the video signal output terminal 406), and a personal computer 600 to the latter (the data communication input output terminal 407), and the construction is such that the image signal stored in the memory of the circuit substrate 405 is output to the television monitor 500 and the personal computer 600 in prescribed operations.

Here, electric devices incorporating organic EL display devices (emitters) of the present invention are not limited to the above. For other examples, there is equipment including televisions, portable televisions, view finder type and monitor direct-view type video tape recorders, PDAs, portable game machines, car audio equipment, automobile meters, CRTs, car navigation systems, pagers, electronic notebooks, electronic desk calculators, clocks, word processors, work stations, videophones, POS terminals, and touch panels.

Furthermore, in the above embodiments, a case is described in which a method of designing the brightness and a program for designing the brightness of an emitter of the present invention are used in a method of designing the brightness and a program for designing the brightness of an organic EL display device. However, the present invention is not limited to this, and may be used for a design method and a design program for an inorganic EL display device.

What is claimed is:

1. An electrooptical device, comprising:

a plurality of types of emission units with different emission aging characteristics;

a circuit element section provided on a substrate and including a drive element;

a first electrode and a second electrode provided with each of the emission units on the circuit element section, each of the emission units being provided between bank sections and between the first electrode and the second electrode, and initial brightnesses and numerical apertures of the emission units being set such that a skew of decay curves of emission brightness of the emission units is within 20% until a prescribed point of time is reached.

2. An electrooptical device according to claim 1, the electrocptical device being capable of displaying colors by constructing one picture element from an emission unit capable of developing a red color, an emission unit capable of developing a green color and an emission unit capable of developing a blue color, comprising:

a circuit element section provided on a substrate and including a drive element; and a first electrode and a second electrode provided with each of the emission units on the circuit element section, each of the emission units being provided between bank sections and between the first electrode and the second electrode, and numerical apertures of the emission units satisfy the following equation:

$$a_r : a_g : a_b = 1:3–8:8–15$$

where $a_r$ is the numerical aperture of the emission unit capable of developing a red color, $a_g$ is the numerical aperture of the emission unit capable of developing a green color, and $a_b$ is the numerical aperture of the emission unit capable of developing a blue color.

3. An electrooptical device according to claim 2, the skew of the decay curves of emission brightness between the emission units until a prescribed point of time is reached being determined based on a normalized decay curve obtained by dividing a decay curve of the emission brightness of each of the emission units by the initial brightness of the emission brightness.

4. An electric device, comprising:

the electrooptical device according to claim 1.

5. A method of designing brightness of an electrooptical device, the electrooptical device comprising a plurality of types of emission units with different emission aging characteristics, a circuit element section provided on a substrate and including a drive element, and a first electrode and a second electrode provided with each of the emission units on the circuit clement section, each of the emission units being provided between bank sections and between the first electrode and the second electrode, the method comprising:

performing an initial value determination process and a numerical aperture determination process to respectively set initial brightness of each of the emission units and a numerical aperture for each of the emission units such that a skew of decay curves of emission brightness of the emission units is within 20% until a prescribed point of time is reached.

6. A method of designing brightness of an electrooptical device according to claim 5, the skew of the decay curves of emission brightness of the emission units until a prescribed point of time is reached being determined based on a normalized decay curve obtained by dividing a decay curve of the emission brightness of each of the emission units by the initial brightness of the emission brightness.

7. A program for designing brightness of an electrooptical device, the electrooptical device comprising a plurality of types of emission units with different emission aging characteristics, a circuit element section provided on a substrate and including a drive element, and a first electrode and a second electrode provided with each of the emission units on the circuit element section, each of the emission units being provided between bank sections and between the first electrode and the second electrode, the program comprising:

performing by computer an initial value determination process and a numerical aperture determination process to respectively set initial brightness of each of the emission units and a numerical aperture for each of the emission units such that a skew of decay curves of emission brightness of the emission units is within 20% until a prescribed point of time is reached.

8. A program for designing brightness of an electrooptical device according to claim 7, the skew of the decay curves of emission brightness of the emission units until a prescribed point of time is reached being determined based on a normalized decay curve obtained by dividing a decay curve of the emission brightness of each of the emission units by the initial brightness of the emission brightness.

* * * * *